United States Patent
Wu (10) Patent No.: US 10,371,724 B2
(45) Date of Patent: Aug. 6, 2019

(54) RECTIFIER PACKAGE MODULE FOR VEHICLE AND CONNECTION STATUS DETECTION METHOD FOR TEMPERATURE SENSOR THEREOF

(71) Applicant: ACTRON TECHNOLOGY CORPORATION, Taoyuan (TW)

(72) Inventor: Chi-Kai Wu, Taoyuan (TW)

(73) Assignee: ACTRON TECHNOLOGY CORPORATION, Taoyuan (TW)

(\*) Notice: Subject to any disclaimer, the term of this patent is extended or adjusted under 35 U.S.C. 154(b) by 281 days.

(21) Appl. No.: 15/439,927

(22) Filed: Feb. 22, 2017

(65) Prior Publication Data

US 2018/0178658 A1 Jun. 28, 2018

(30) Foreign Application Priority Data

Dec. 23, 2016 (TW) .............................. 105142891 A (51) Int. Cl.
| | |
|---|---|
| B60L 11/18 | (2006.01) |
| G01K 3/08 | (2006.01) |
| G01R 19/165 | (2006.01) |
| H01L 23/00 | (2006.01) |
| H01L 23/495 | (2006.01) |
| H02M 7/00 | (2006.01) |

(Continued)

(52) U.S. Cl.
CPC ......... *G01R 19/16523* (2013.01); *G01K 7/01* (2013.01); *G01K 15/007* (2013.01); *H01L 23/49524* (2013.01); *H01L 23/49562* (2013.01); *H01L 23/49575* (2013.01); *H01L 24/48* (2013.01); *H01L 2224/48245* (2013.01); *H01L 2924/12035* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 2011/0073984 A1* | 3/2011 | Lee ..................... | H01L 23/3107 257/467 |
| 2011/0220636 A1* | 9/2011 | Hendricks ............ | H05B 1/0252 219/494 |
| 2012/0119913 A1* | 5/2012 | Yu .......................... | G01K 3/005 340/584 |

FOREIGN PATENT DOCUMENTS

JP  2016166860  9/2016

OTHER PUBLICATIONS

"Office Action of Taiwan Counterpart Application," dated Aug. 2, 2017, p.1-p.6, in which the listed reference was/references were cited.

\* cited by examiner

*Primary Examiner* — Jared Fureman
*Assistant Examiner* — Aqeel H Bukhari
(74) *Attorney, Agent, or Firm* — JCIPRNET (57) ABSTRACT

A rectifier package module for a vehicle and a connection status detection method for a temperature sensor thereof are provided. The rectifier package module includes at least one temperature sensor and a control chip. The control chip has an end coupled to the temperature sensor through a bonding wire. The control chip generates a current and provides a reference voltage according to a mode selection signal. The current is provided to the temperature sensor through the bonding wire. The control chip compares a voltage on the end with the reference voltage to generate a comparison result. In a test mode, a comparison circuit generates the comparison result to indicate a connection status between the end and the temperature sensor.

11 Claims, 7 Drawing Sheets

(51) Int. Cl.
*G01K 7/01* (2006.01)
*G01K 15/00* (2006.01)

RECTIFIER PACKAGE MODULE FOR VEHICLE AND CONNECTION STATUS DETECTION METHOD FOR TEMPERATURE SENSOR THEREOF

CROSS-REFERENCE TO RELATED APPLICATION

This application claims the priority benefit of Taiwan application serial no. 105142891, filed on Dec. 23, 2016. The entirety of the above-mentioned patent application is hereby incorporated by reference herein and made a part of this specification.

BACKGROUND OF THE INVENTION

Field of the Invention

The invention relates to a rectifier package module for a vehicle and more particularly relates to a connection status detection method for a temperature sensor of the rectifier package module for the vehicle.

Description of Related Art

In the field of generators, it is common to dispose a rectifier bridge for rectifying alternative current (AC) to generate direct current (DC). According to the conventional technology, the rectifier bridge may be composed of transistors or diodes and be configured to provide a rectified voltage as a basis for driving the load.

In order to detect the working status of the rectifier bridge, it is necessary to detect the ambient temperature around the rectifier bridge. Therefore, it is required to dispose an appropriate number of temperature sensors near the transistors or diodes that form the rectifier bridge. To obtain a temperature sensing result of the temperature sensor, a control chip in the vehicle rectifier may be connected to the temperature sensor through wires for information transmission. However, these wires may deteriorate or even be disconnected due to packaging or long-term use, which results in that the control chip may not be able to obtain the status of temperature change on the rectifier bridge correctly. As a result, the vehicle rectifier may function abnormally and even have a risk to be damaged.

SUMMARY OF THE INVENTION

The invention provides a rectifier package module for a vehicle and a connection status detection method for a temperature sensor thereof for performing a self-test on an interconnection status of the temperature sensor.

The rectifier package module for the vehicle according to the invention includes at least one temperature sensor and a control chip. The control chip has an end. The end is coupled to the at least one temperature sensor through at least one bonding wire. The control chip generates a current and provides a reference voltage according to a mode selection signal. The current is provided to the at least one temperature sensor through the at least one bonding wire. The control chip compares a voltage on the end with the reference voltage to generate a comparison result. In a test mode, a comparison circuit generates the comparison result to indicate a connection status between the end and the temperature sensor.

In the rectifier package module for the vehicle according to the invention, the temperature sensor is coupled to one end in the rectifier package module through at least one bonding wire. A connection status detection method for the temperature sensor includes: generating a current according to a mode selection signal, wherein the current is provided to the temperature sensor; providing a reference voltage according to the mode selection signal; and comparing a voltage on the end with the reference voltage to generate a comparison result, which indicates a connection status between the temperature sensor and the end in a test mode.

Based on the above, in the test mode, the control chip of the invention determines whether the temperature sensor is properly connected to the control chip or not according to the state of the voltage on the end of the control chip, which is coupled to the bonding wire, by providing the current to flow through the bonding wire coupled to the temperature sensor. Accordingly, the self-test function of the control chip helps to confirm the normal operation of the temperature sensor and ensure the performance and safety of the vehicle rectifier.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
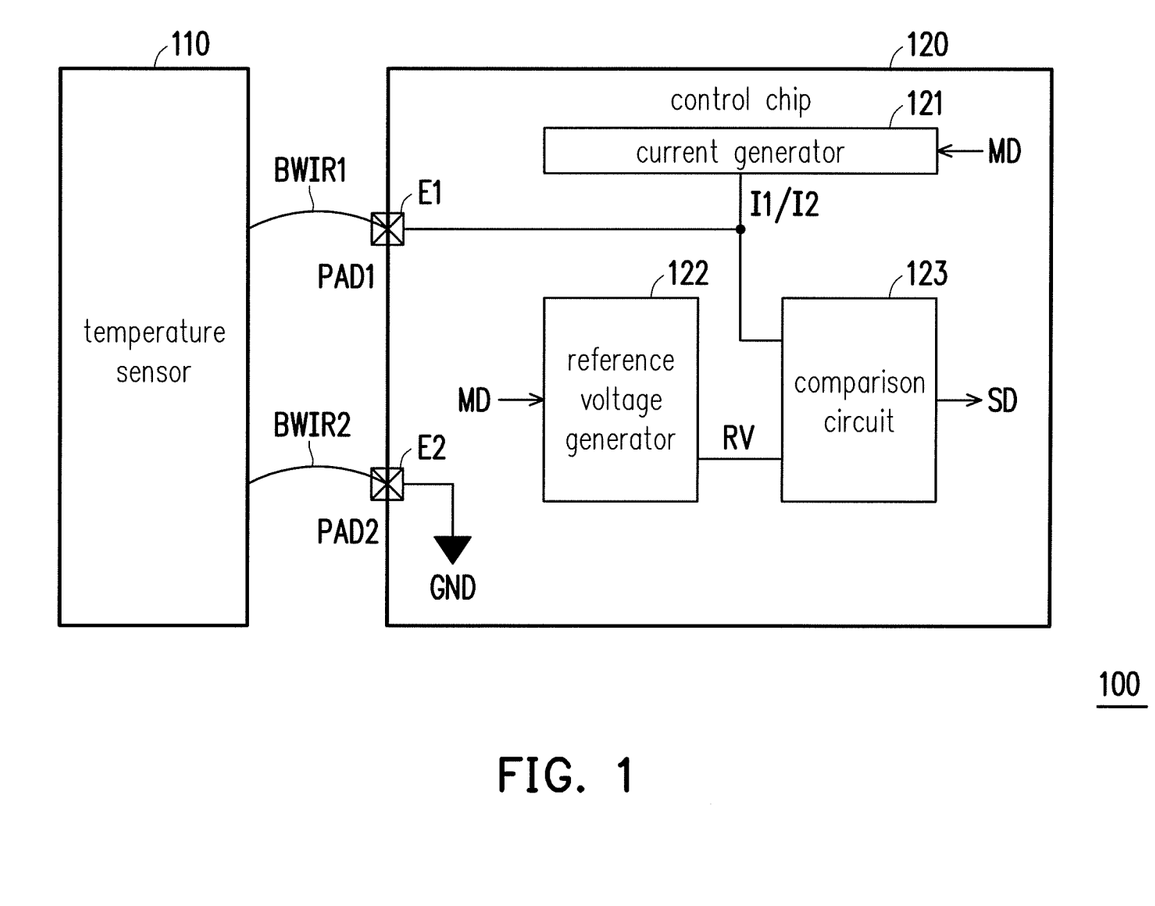
FIG. 1 is a schematic diagram illustrating a rectifier package module for a vehicle according to an embodiment of the invention.

Referring to FIG. 1, FIG. 1 is a schematic diagram illustrating a rectifier package module for a vehicle according to an embodiment of the invention. A rectifier package module 100 for a vehicle includes one or more temperature sensors 110 and a control chip 120. The control chip 120 has pads PAD1 and PAD2 thereon. The pads PAD1 and PAD2 on the control chip 120 respectively form ends E1 and E2, which are respectively coupled to the temperature sensor 110 through bonding wires BWIR1 and BWIR2. The control chip 120 includes a current generator 121, a reference voltage generator 122, and a comparison circuit 123, for example. The current generator 121 is coupled to the end E1 and the comparison circuit 123. The current generator 121 receives a mode selection signal MD and generates a current I1 or a current I2 to be provided to the end E1 according to the mode selection signal MD. In this embodiment, the current I1 or the current I2 provided by the current generator 121 flows to the temperature sensor 110 through the end E1 and the bonding wire BWIR1, and flows through the temperature sensor 110 and then flows to the end E2 through the bonding wire BWIR2 to flow to a reference ground end GND. By providing the current I1 or the current I2 having different current values to flow through the temperature sensor 110, the end E1 can provide different voltage values thereon.

The reference voltage generator 122 is coupled to the comparison circuit 123. The reference voltage generator 122 receives the mode selection signal MD and provides a reference voltage RV to the comparison circuit 123 according to the mode selection signal MD. Moreover, the comparison circuit 123 compares the voltage on the end E1 with the reference voltage RV to generate a comparison result SD.

In terms of details of the operation, the control chip 120 may operate in a normal mode and a test mode according to the mode selection signal MD. In the test mode, the current generator 121 provides the current I1, which has the smaller current value between the current I1 and the current I2, to the end E1 according to the mode selection signal MD. Meanwhile, the reference voltage generator 122 selects one of a first voltage and a second voltage, which has the greater voltage value therebetween, as the reference voltage RV (e.g., the first voltage). In the test mode, if the bonding wires BWIR1 and BWIR2 are both normal and effectively connected between the control chip 120 and the temperature sensor 110, the current I1 flows to the temperature sensor 110 through the bonding wire BWIR1 and flows to the reference ground end GND through the bonding wire BWIR2. Accordingly, the voltage value on the end E1 is substantially equal to a voltage drop that is generated when the current I1 passes through the temperature sensor 110. On the other hand, if at least one of the bonding wires BWIR1 and BWIR2 is not effectively connected between the control chip 120 and the temperature sensor 110 and is disconnected or falls off, the voltage value on the end E1 becomes equal to a relatively high voltage value (substantially equal to the voltage value of an operation power received by the current generator 121) due to a pull-up operation of the current I1 provided by the current generator 121.

It is known from the above that, in the test mode, the comparison circuit 123 determines whether the voltage value on the end E1 is greater than the reference voltage RV through comparison to obtain the connection status of the bonding wires BWIR1 and BWIR2. Specifically, in the test mode, if the voltage value on the end E1 is greater than the reference voltage RV, it indicates that an electrical circuit formed by the bonding wires BWIR1 and BWIR2 and the temperature sensor 110 is defective or may be disconnected. At this time, the comparison result SD generated by the comparison circuit 123 indicates the situation that at least one of the bonding wires BWIR1 and BWIR2 may be disconnected. On the other hand, in the test mode, if the voltage value on the end E1 is smaller than the reference voltage RV, it indicates that the electrical circuit formed by the bonding wires BWIR1 and BWIR2 and the temperature sensor 110 is normal. At this time, the comparison result SD generated by the comparison circuit 123 indicates that the bonding wires BWIR1 and BWIR2 are properly connected between the temperature sensor 110 and the control chip 120.

It should be noted that, in the test mode, the voltage value of the reference voltage RV provided by the reference voltage generator 122 is preset. In the embodiment of the invention, the voltage value of the reference voltage RV is set in accordance with the voltage value of the operation power received by the current generator 121 minus an offset value. The offset value may be set by the designer according to the actual requirements and is not necessarily fixed.

After the test operation of the test mode is completed, if it is detected that the temperature sensor 110 is well connected to the control chip 120, the control chip 120 enters the normal mode. In the normal mode, the control chip 120 detects a change status of an ambient temperature through the temperature sensor 110. Specifically, in the normal mode, the current generator 121 provides the current I2, which has the greater current value among the current I1 and the current I2, to the end E1 according to the mode selection signal MD. Meanwhile, the reference voltage generator 122 selects the voltage (e.g., the second voltage), which has the smaller voltage value between the first voltage and the second voltage, as the reference voltage RV. In the normal mode, on the basis that the bonding wires BWIR1 and BWIR2 are both normal and are effectively connected between the control chip 120 and the temperature sensor 110, the current I2 flows to the temperature sensor 110 through the bonding wire BWIR1 and flows to the reference ground end GND through the bonding wire BWIR2. At this time, the temperature sensor 110 provides different conductive voltage drops according to the ambient temperature. Accordingly, the voltage value on the end E1 changes in response to the change of the ambient temperature.

Meanwhile, the comparison circuit 123 compares a voltage VE1 on the end E1 with the current reference voltage RV, and the comparison result SD generated by the comparison circuit 123 reflects the change status of the ambient temperature.

In the normal mode, the voltage value of the reference voltage RV is set in accordance with a preset temperature threshold value. If the ambient temperature in the rectifier package module 100 is desired not to exceed the temperature threshold value, the voltage value of the reference voltage RV in the normal mode is set according to an impedance value provided by the temperature sensor 110 corresponding to the temperature threshold value and the current value of the current I2. In the normal mode, if the comparison circuit 123 determines that the voltage value on the end E1 is greater than the reference voltage RV, it indicates that the rectifier package module 100 is not overheated and remains in the normal operation. On the other hand, if the comparison circuit 123 determines that the voltage VE1 on the end E1 is smaller than the reference voltage RV, it indicates that the rectifier package module 100 is overheated, and a corresponding operation is required so as to maintain system stability and safety.

Figure 2:
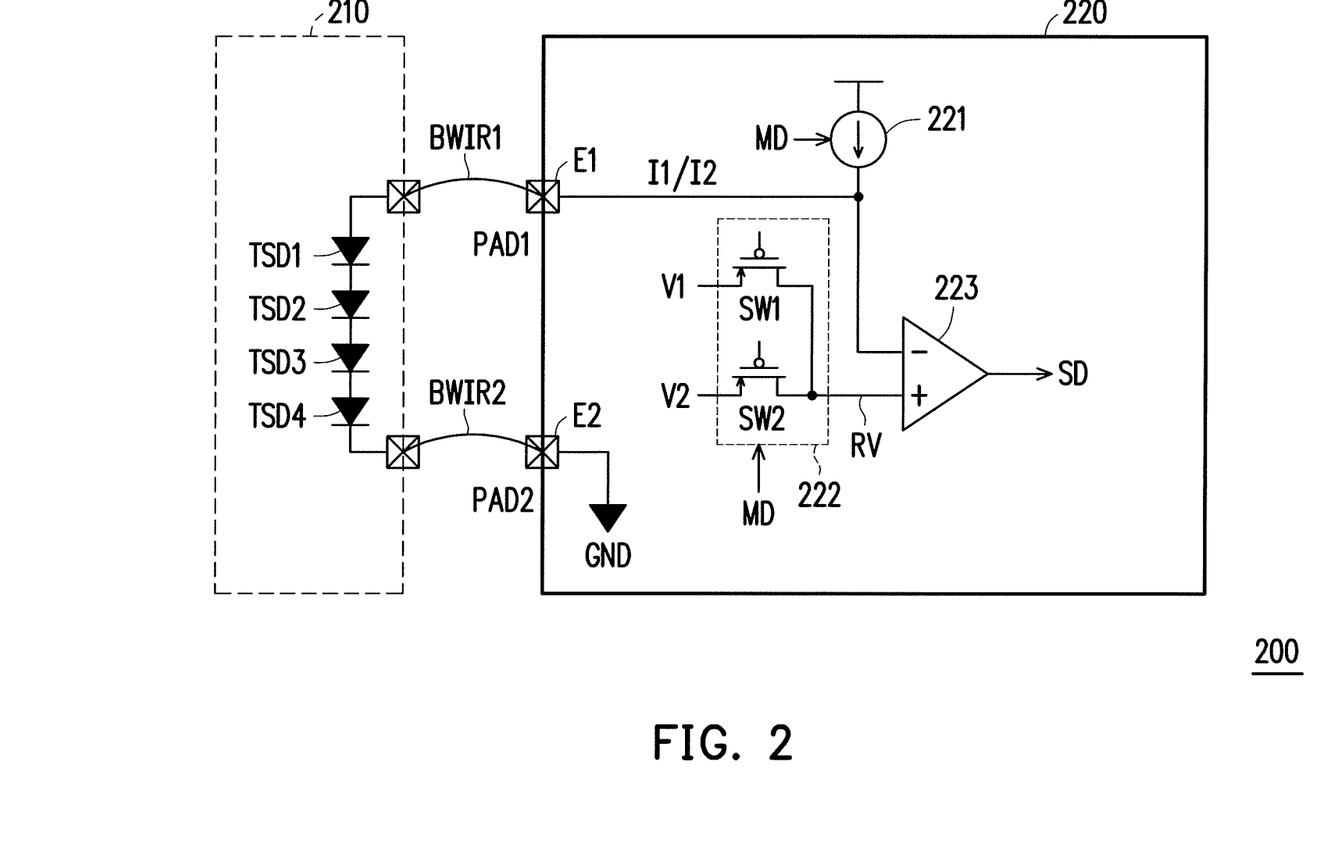
FIG. 2 is a schematic diagram illustrating a rectifier package module for a vehicle according to another embodiment of the invention.

Hereinafter, referring to FIG. 2, FIG. 2 is a schematic diagram illustrating a rectifier package module for a vehicle according to another embodiment of the invention. A rectifier package module 200 for a vehicle includes a temperature sensor 210 and a control chip 220. The control chip 220 is coupled to the temperature sensor 210 through bonding wires BWIR1 and BWIR2. The control chip 220 includes a current generator 221, a reference voltage generator 222, and a comparison circuit 223, for example. The current generator 221 receives a mode selection signal MD and generates a current I1 or a current I2 according to the mode selection signal MD.

The reference voltage generator 222 receives a first voltage V1, a second voltage V2, and the mode selection signal MD, and selects one of the first voltage V1 and the second voltage V2 as the reference voltage RV according to the mode selection signal MD. Moreover, the reference voltage generator 222 provides the reference voltage RV to the comparison circuit 223. In this embodiment, the reference voltage generator 222 includes switches SW1 and SW2. The switches SW1 and SW2 are transistor switches and are controlled by the mode selection signal MD. The switches SW1 and SW2 respectively receive the first voltage V1 and the second voltage V2. In the test mode, the switch SW1 is turned on while the switch SW2 is turned off, and the reference voltage generator 222 sets the voltage V1 as the reference voltage RV. On the other hand, in the normal mode, the switch SW2 is turned on while the switch SW1 is turned off, and the reference voltage generator 222 sets the voltage V2 as the reference voltage RV. The switches SW1 and SW2 are not turned on at the same time.

The comparison circuit 223 is coupled to the current generator 221 and the reference voltage generator 222 and compares the voltage on the end E1 with the reference voltage RV to generate the comparison result SD. In this embodiment, the comparison circuit 223 may be constructed by an operational amplifier. Those skilled in the art may use the configuration of a common comparison circuit to implement the comparison circuit 223, which is not particularly limited.

The temperature sensor 210 includes a plurality of diodes TSD1 to TSD4 that are connected in series. The diodes TSD1 to TSD4 are sequentially forward biased between the end E1 and the end E2. Take the diode TSD1 as an example, an anode of the diode TSD1 is coupled to the end E1 and a cathode thereof is coupled to the reference ground end GND.

It should be noted that the number of the diodes included in the temperature sensor 210 is not particularly limited. With diodes having different electrical characteristics, the designer may dispose one diode or more diodes that are connected in series in the temperature sensor 210, and the number thereof is not particularly limited. Moreover, using the diodes to construct the temperature sensor 210 is merely one example. In some embodiments of the invention, other temperature-sensitive electronic components, e.g., thermistor, may be used to design the temperature sensor 210.

In terms of details of the operation, in the test mode, the current generator 221 generates the current I1 of one microampere (1 µA), for example, according to the mode selection signal MD and causes the current I1 to flow to the end E1. Meanwhile, the reference voltage generator 222 turns on the switch SW1 and turns off the switch SW2 according to the mode selection signal MD. Accordingly, the reference voltage generator 222 provides the voltage V1 of 3V, for example, as the reference voltage RV.

In the test mode, the comparison circuit 223 determines whether the voltage on the end E1 is greater than the reference voltage RV or not through comparison. If the bonding wires BWIR1 and BWIR2 are properly connected between the temperature sensor 210 and the control chip 220, in a normal temperature range, the voltage value on the end E1 is not greater than the reference voltage RV. Therefore, whether the connection status of the bonding wires BWIR1 or BWIR2 is normal is obtained according to the comparison result SD generated by the comparison circuit 223.

On the other hand, in the normal mode, the control chip 220 performs a detection operation on the ambient temperature. At this time, the current generator 221 generates the current I2 of 8 µA, for example, according to the mode selection signal MD and causes the current I2 to flow to the end E1. Meanwhile, the reference voltage generator 222 turns on the switch SW2 and turns off the switch SW1 according to the mode selection signal MD. Accordingly, the reference voltage generator 222 provides the voltage V2 of 0.8V, for example, as the reference voltage RV.

Since the connection status of the bonding wires BWIR1 and BWIR2 at the time is normal, the current I2 flows from the end E1 and passes through the diode string of the temperature sensor 210 through the bonding wire BWIR1. The diode string in the temperature sensor 210 provides different conductive voltage drops according to different ambient temperatures. Accordingly, the voltage on the end E1 has different voltage values due to change of the ambient temperature.

The reference voltage RV (i.e., the second voltage V2) provided by the comparison circuit 222 is set corresponding to the voltage value that may be generated on the end E1 when the ambient temperature is equal to 215 degrees Celsius (i.e., the temperature threshold value), for example. Therefore, when the comparison circuit 222 determines that the voltage on the end E1 is smaller than the reference voltage RV through comparison, it indicates that the ambient temperature in the rectifier package module 200 is excessively high (greater than 215 degrees Celsius), which raises the concern of overheat. On the other hand, when the comparison circuit 222 determines that the voltage on the end E1 is greater than the reference voltage RV through comparison, it indicates that the ambient temperature in the rectifier package module 200 does not have the problem of overheat.

In other embodiments of the invention, the number of the temperature sensors 210 in the rectifier package module 200 is not necessarily one. A plurality of the temperature sensors 210 may be combined with the circuits formed by the current generator 221, the reference voltage generator 222, and the comparison circuit 223, and the connection status detection and temperature detection operation of each of the temperature sensors 210 can be executed independently and normally.

In the embodiments described above, those skilled in the art may also use other common circuit components/architectures to implement the technical solution that the control chips 120 and 220 execute for detecting the connection status of the temperature sensor in the vehicle rectifier module, and do not necessarily use the current generators 121 and 221, the reference voltage generators 122 and 222, and the comparison circuits 123 and 223.

Figure 3A:
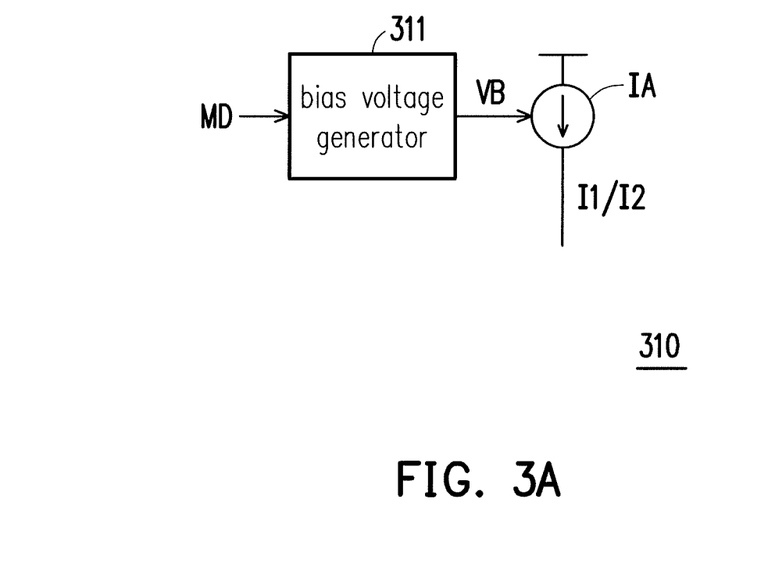
FIG. 3A and FIG. 3B are schematic diagrams respectively illustrating different embodiments of the current generator of the invention.
Figure 3B:
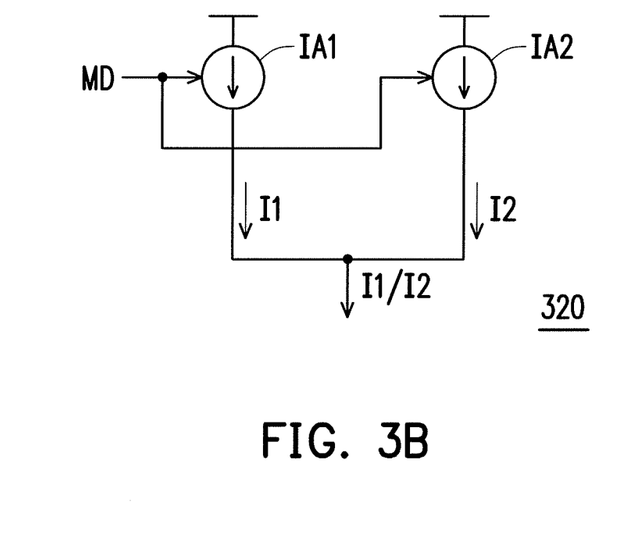

Hereinafter, referring to FIG. 3A and FIG. 3B, FIG. 3A and FIG. 3B are schematic diagrams respectively illustrating different embodiments of the current generator of the invention. In FIG. 3A, a current generator 310 includes a voltage control current source IA. The voltage control current source IA receives a bias voltage VB and generates the current I1 or the current I2 according to the bias voltage VB. The bias voltage VB may be generated by a bias voltage generator 311. The bias voltage generator 311 receives the mode selection signal MD and generates the bias voltage VB according to the mode selection signal MD.

Regarding the hardware architectures for implementing the voltage control current source IA and the bias voltage VB, there is no specific limitation and it is possible to use the hardware architectures of the common voltage control current source and voltage generator that those skilled in the art are familiar with.

In FIG. 3B, the current generator 310 includes a first current source IA1 and a second current source IA2. The first current source IA1 and the second current source IA2 receive the mode selection signal MD, and according to the mode selection signal MD, the first current source IA1 is enabled to provide the current I1 or the second current source IA2 is enabled to provide the current I2. For example, when the mode selection signal MD is at a first logic level (corresponding to the test mode), the first current source IA1 is enabled and provides the current I1 (the second current source IA2 does not operate at this time). On the other hand, when the mode selection signal MD is at a second logic level (corresponding to the normal mode), the second current source IA2 is enabled and provides the current I2 (the first current source IA1 does not operate at this time).

In this embodiment, the first current I1 and the second current I2 are not provided at the same time.

Figure 4A:
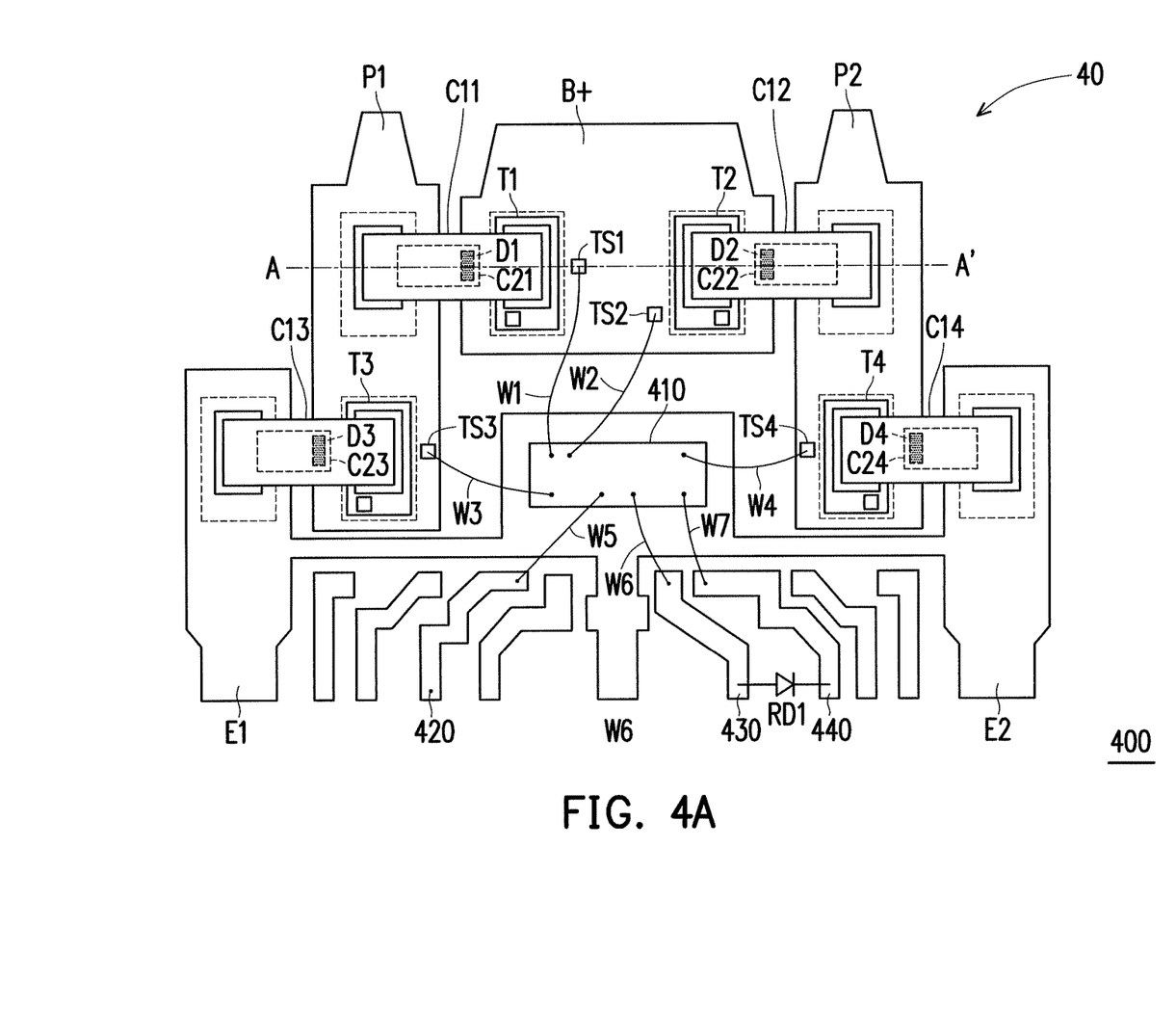
FIG. 4A is a schematic diagram illustrating a rectifier package module for a vehicle according to another embodiment of the invention.
Figure 4B:
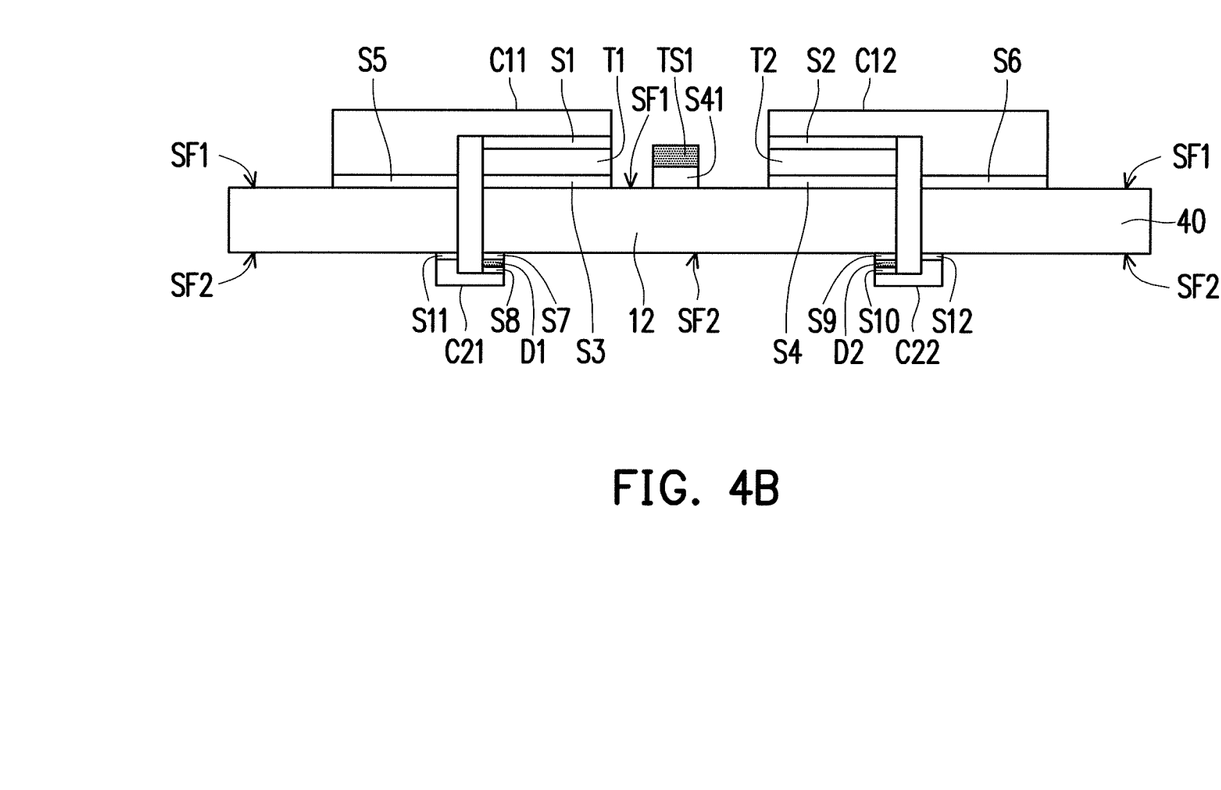
FIG. 4B is a schematic cross-sectional diagram illustrating a rectifier package module 400 for a vehicle along the line A-A'.

Hereinafter, referring to FIG. 4A and FIG. 4B, FIG. 4A is a schematic diagram illustrating a rectifier package module for a vehicle according to another embodiment of the invention, and FIG. 4B is a schematic cross-sectional diagram illustrating a rectifier package module 400 for a vehicle along the line A-A'. The rectifier package module 400 includes a lead frame 40, a control chip 410, transistors T1 to T4, Zener diodes D1 to D4, and temperature sensors TS1 to TS4. The transistors T1 to T4 are disposed at different positions on a first surface of the lead frame 40. The Zener diodes D1 to D4 are disposed on a second surface of the lead frame 40 at positions respectively corresponding to the transistors T1 to T4. The first surface is opposite to the second surface. The temperature sensors TS1 to TS4 are disposed on the first surface of the lead frame 40 at positions respectively adjacent to the transistors T1 to T4. The temperature sensors TS1 to TS4 may be electrically connected to the control chip 410 respectively through bonding wires W1 to W4.

Moreover, the transistors T1 to T4 may be metal oxide semiconductor field effect transistors. The rectifier package module 400 further includes a plurality of conductive structures C11 to C14 so as to electrically connect the transistors T1 to T4 to different positions of the lead frame 40 respectively.

Figure 5:
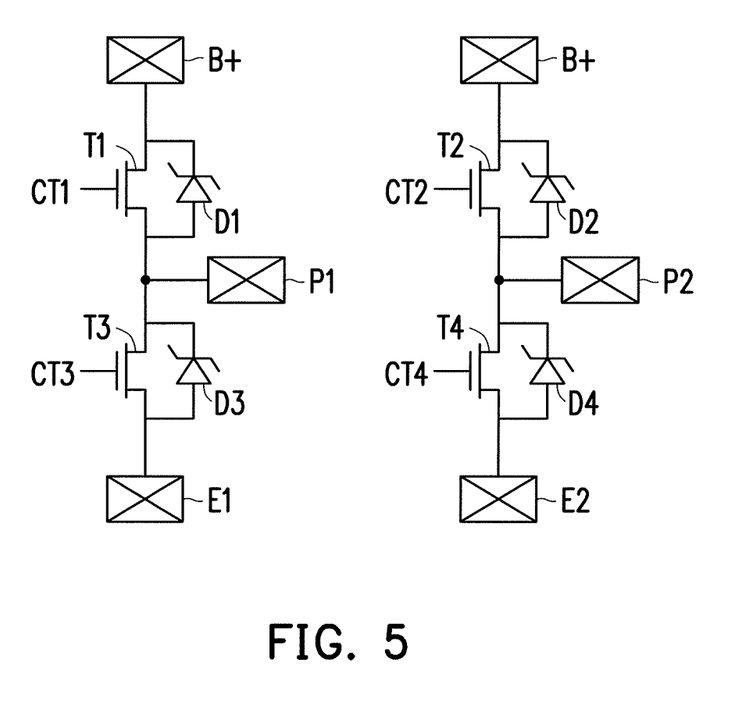
FIG. 5 is an equivalent circuit diagram of a rectifier bridge of a rectifier package module for a vehicle according to an embodiment of the invention.

The transistors T1 to T4 form a plurality of rectifier bridges. The transistors T1 and T3 are connected in series sequentially between a power pin B+ and a ground pin E1. The transistors T2 and T4 are connected in series sequentially between the power pin B+ and a ground pin E2. An equivalent circuit thereof is illustrated by FIG. 5, which is an equivalent circuit diagram of the rectifier bridge of the rectifier package module according to an embodiment of the invention. In addition, the Zener diodes D1 to D4 are respectively coupled between both ends (source and drain) of the transistors T1 to T4 to serve as an overvoltage protection component of the transistors T1 to T4.

Moreover, the transistors T1 to T4 respectively receive control signals CT1 to CT4, which may be provided by the control chip 410. The control chip 410 is connected to control ends of the transistors T1 to T4 through bonding wires to respectively provide the control signals CT1 to CT4. The transistors T1 and T3 are coupled to a phase output pin P and the transistors T2 and T4 are coupled to a phase output pin P2.

In this embodiment, the lead frame 40 includes an external lead pin 420. The external lead pin 420 is connected to the control chip 410 through a bonding wire W5. Accordingly, the control chip 410 is able to transmit the comparison result SD described in the above embodiment to an external electronic device through the bonding wire W5. The comparison result SD may be transmitted by any serial communication protocol, such as an inter-integrated circuit (I2C), a serial peripheral interface (SPI), and a single-line communication protocol, which is not particularly limited.

The rectifier package module 400 further includes a diode RD1. The diode RD1 is disposed between two external lead pins 430 and 440 in the lead frame 40. The diode RD1 is disposed to bridge the two external lead pins 430 and 440 that are adjacent to each other. More specifically, an anode of the diode RD1 is electrically connected to the external lead pin 430 and a cathode of the diode RD1 is electrically connected to the external lead pin 440. Moreover, the control chip 410 is connected to the external lead pin 430 through a bonding wire W6 and then is connected to the anode of the diode RD1. In the control chip 410, a pad carrying the bonding wire W6 may be electrically connected to the power pin B+ through an internal wire and other bonding wires (power transmission wires). Furthermore, the control chip 410 is connected to the external lead pin 440 through a bonding wire W7 and then is connected to the cathode of the diode RD1. A pad carrying the bonding wire W7 is connected to a power receiving end of the control chip 410. Accordingly, the diode RD1 is forward biased between the power pin B+ and the power receiving end of the control chip 410.

It should be noted that if the user reversely connects the vehicle battery by accident when connecting the vehicle battery, the reversely biased diode RD1 may be disconnected, so as to prevent the voltage reversely connected between the power pin B+ and the reference ground pin E1 from being provided to the control chip 410. Thus, the circuit components in the control chip 410 would not be immediately burned and damaged due to the reverse connection of the vehicle battery. It gives the user a certain period of time to correct the erroneous connection of the vehicle battery, so as to maintain proper operation of the rectifier package module 400. On the other hand, if the user connects the vehicle battery correctly, the diode RD1 is turned on, so as to provide power to the rectifier package module 400 normally.

Moreover, in FIG. 4B, the lead frame 40 has a first surface SF1 and a second surface SF2. The first surface SF1 carries the transistors T1 and T2 thereon. The first surface of the lead frame 40 is electrically connected to the first ends of the transistors T1 and T2 respectively through conductive adhesive layers S1 and S2. The second ends of the transistors T1 and T2 are electrically connected to respective ends of the conductive structures C11 and C12 respectively through conductive adhesive layers S3 and S4. The other ends of the conductive structures C11 and C12 are electrically connected to the first surface SF1 of the lead frame 40 respectively through the conductive adhesive layers S5 and S6.

Moreover, the second surface SF2 of the lead frame 40 is electrically connected to the cathodes of the Zener diodes D and D2 through conductive adhesive layers S7 and S9. The anodes of the Zener diodes D1 and D2 are electrically connected to respective ends of conductive structures C21 and C22 respectively through conductive adhesive layers SS8 and S10. The other ends of the conductive structures C21 and C22 are electrically connected to the second surface SF2 of the lead frame 40 respectively through conductive adhesive layers S11 and S12.

In this embodiment, the conductive adhesive layers S1 to S12 may be composed of solder or any other conductive adhesive material that those skilled in the art are familiar with, which is not particularly limited.

In FIG. 4B, the temperature sensor TS1 is electrically connected to the first surface SF1 of a block 12 at a position adjacent to the transistor T1 through a conductive adhesive layer S41, so as to detect the status of temperature change of the transistor T1.

Figure 6:
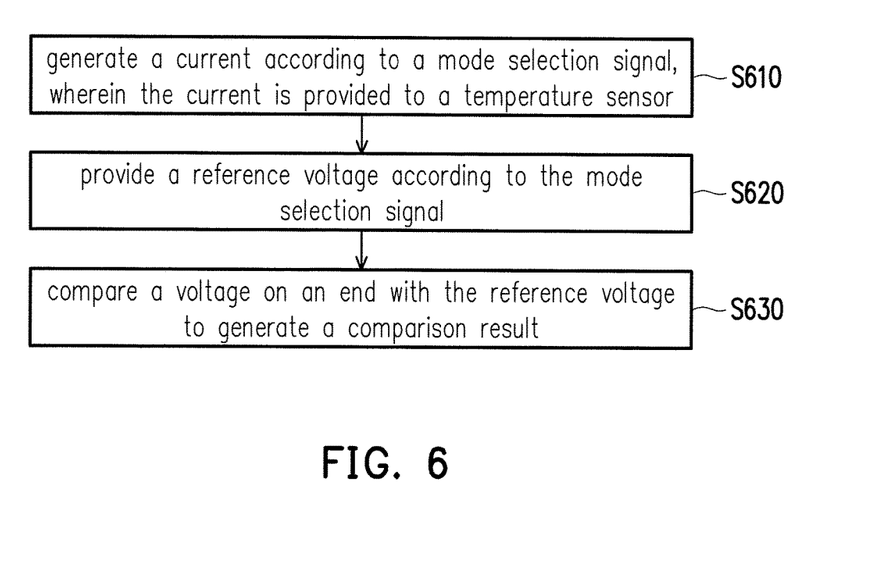
FIG. 6 is a flowchart illustrating a connection status detection method for the temperature sensor in the rectifier package module for the vehicle according to an embodiment of the invention.

Hereinafter, referring to FIG. 6, FIG. 6 is a flowchart illustrating a connection status detection method for the temperature sensor in the rectifier package module for the vehicle according to an embodiment of the invention. In the rectifier package module for the vehicle, the temperature sensor is coupled to one end in the package module through at least one bonding wire. The connection status detection method for the temperature sensor includes the following steps. In Step S610, a current is generated according to a mode selection signal, wherein the current is provided to the temperature sensor. In Step S620, a reference voltage is provided according to the mode selection signal. Finally, in Step S630, a voltage on the end is compared with the reference voltage to generate a comparison result. In a test mode, the comparison result indicates the connection status between the temperature sensor and the end.

Details of the above steps have been specified in the foregoing embodiments and examples of the invention and thus are not repeated hereinafter.

To sum up, according to the invention, different currents are provided to flow through the temperature sensor in different modes for detecting the voltage on the end of the control chip, which is connected to the temperature sensor, so as to determine the connection status between the temperature sensor and the control chip, and detect whether the ambient temperature in the rectifier package module is overly high. The self-test function provided by the control chip of the invention helps to improve the reliability of the temperature detection of the temperature sensor and ensure the stability of performance of the rectifier package module.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A rectifier package module for a vehicle, comprising:
at least one temperature sensor; and
a control chip having an end coupled to the at least one temperature sensor through at least one bonding wire, wherein the control chip generates a current and provides a reference voltage according to a mode selection signal, the current is provided to the at least one temperature sensor through the at least one bonding wire to generate a voltage on an end of the at least one bonding wire, and the control chip compares the voltage on the end with the reference voltage to generate a comparison result,
wherein in a test mode, the comparison result indicates whether the at least one temperature sensor is well connected to the control chip or not.

2. The rectifier package module for the vehicle according to claim 1, wherein the current comprises a first current or a second current having different current values, and the reference voltage comprises a first voltage or a second voltage having different voltage values, wherein the control chip comprises:
a current generator generating the first current or the second current according to the mode selection signal;
a reference voltage generator providing the first voltage or the second voltage as the reference voltage according to the mode selection signal; and
a comparison circuit coupled to the current generator and the reference voltage generator and comparing the voltage on the end with the reference voltage to generate the comparison result.

3. The rectifier package module for the vehicle according to claim 2, wherein:
in the test mode, the current generator provides the first current to the at least one temperature sensor and the reference voltage generator selects the first voltage as the reference voltage; and
in a normal mode, the current generator provides the second current to the at least one temperature sensor, and the reference voltage generator selects the second voltage as the reference voltage, and the comparison circuit generates the comparison result to indicate a relationship between an ambient temperature and a temperature threshold value.

4. The rectifier package module for the vehicle according to claim 3, wherein the at least one temperature sensor provides a conductive voltage drop according to the ambient temperature, and the at least one temperature sensor comprises:
at least one diode having an anode coupled to the end and a cathode coupled to a reference ground end.

5. The rectifier package module for the vehicle according to claim 1, further comprising:
a lead frame, wherein the at least one temperature sensor and the control chip are respectively disposed on different regions of a first surface of the lead frame; and
a plurality of transistors disposed on the first surface of the lead frame to form at least one rectifier bridge,
wherein the at least one temperature sensor and the transistors are disposed adjacent to each other.

6. The rectifier package module for the vehicle according to claim 5, wherein the lead frame comprises at least one external lead pin, and the control chip is coupled to the at least one external lead pin and transmits the comparison result through the at least one external lead pin.

7. The rectifier package module for the vehicle according to claim 6, further comprising:
a diode disposed between adjacent two external lead pins of the lead frame, wherein the control chip electrically connects a power pin of the lead frame to an anode of the diode and couples a cathode of the diode to a power receiving end of the control chip through a plurality of power transmission wires.

8. The rectifier package module for the vehicle according to claim 5, further comprising:
a plurality of Zener diodes disposed on a second surface of the lead frame, wherein the first surface is opposite to the second surface and the Zener diodes are respectively connected in series between first ends and second ends of the transistors,
wherein the transistors comprise a metal oxide semiconductor field effect transistor.

9. A connection status detection method for a temperature sensor in a rectifier package module for a vehicle, wherein the temperature sensor is coupled to an end of the rectifier package module through at least one bonding wire, the connection status detection method comprising:

generating a current according to a mode selection signal, wherein the current is provided to the temperature sensor through the at least one bond wire to generate a voltage on an end of the at least one bond wire;

providing a reference voltage according to the mode selection signal; and     comparing the voltage on the end with the reference voltage to generate a comparison result, wherein in a test mode, the comparison result indicates whether a the temperature sensor is well connected to the control chip or not.

10. The connection status detection method according to claim 9, wherein the current comprises a first current or a second current having different current values, and the reference voltage comprises a first voltage or a second voltage having different voltage values, and the step of providing the reference voltage comprises: selecting one of the first voltage and the second voltage as the reference voltage according to the mode selection signal, wherein:

in the test mode, the first current is provided to the temperature sensor and the first voltage is selected as the reference voltage; and     in a normal mode, the second current is provided to the temperature sensor and the second voltage is selected as the reference voltage, wherein the comparison result indicates a relationship between an ambient temperature and a temperature threshold value.

11. The connection status detection method according to claim 10, wherein:

the first current and the second current are generated at different times, and the current value of the first current is smaller than the current value of the second current;

the voltage value of the first voltage is greater than the voltage value of second voltage;

in the test mode, when the voltage on the end is greater than the reference voltage, the comparison result indicates that the end and the temperature sensor are disconnected; and     in the normal mode, when the voltage on the end is smaller than the reference voltage, the comparison result indicates that the ambient temperature is greater than the temperature threshold value.

* * * * *